(12) United States Patent
Cohen et al.

(10) Patent No.: US 7,349,587 B2
(45) Date of Patent: Mar. 25, 2008

(54) MAGNETIC SCANNING APPARATUS

(75) Inventors: Emanuel Cohen, Manchester (GB); Naar-Eddine Djennati, Manchester (GB)

(73) Assignee: Hall Effect Technologies Ltd., Manchester (GB)

( * ) Notice: Subject to any disclaimer, the term of this patent is extended or adjusted under 35 U.S.C. 154(b) by 818 days.

(21) Appl. No.: 10/475,955

(22) PCT Filed: Mar. 13, 2002

(86) PCT No.: PCT/GB02/01135

§ 371 (c)(1),
(2), (4) Date: Oct. 24, 2003

(87) PCT Pub. No.: WO02/073227

PCT Pub. Date: Sep. 19, 2002

(65) Prior Publication Data

US 2004/0171926 A1    Sep. 2, 2004

(30) Foreign Application Priority Data

Mar. 14, 2001 (GB) .................... 0106355.1

(51) Int. Cl.
*G06K 9/20* (2006.01)
(52) U.S. Cl. .................................... 382/320
(58) Field of Classification Search ............... 382/100, 382/135, 320; 324/318, 200, 244–252; 235/449, 235/493; 600/407, 409, 410
See application file for complete search history.

(56) References Cited

U.S. PATENT DOCUMENTS

| | | | |
|---|---|---|---|
| 4,097,802 A * | 6/1978 | Mazzeo et al. ............. 324/252 |
| 4,124,814 A | 11/1978 | Lauerman | |
| 5,038,785 A * | 8/1991 | Blakeley et al. ............. 600/484 |
| 5,389,951 A | 2/1995 | Baker | |
| 5,570,903 A | 11/1996 | Meister et al. | |
| 5,992,601 A * | 11/1999 | Mennie et al. ............... 194/207 |
| 6,068,595 A * | 5/2000 | Miyazaki et al. ........... 600/410 |
| 7,119,553 B2 * | 10/2006 | Yang et al. .................. 324/663 |
| 7,145,330 B2 * | 12/2006 | Xiao .......................... 324/244 |
| 7,155,271 B2 * | 12/2006 | Halperin et al. ............ 600/411 |

FOREIGN PATENT DOCUMENTS

| | | |
|---|---|---|
| WO | WO 99/05312 | 5/1990 |
| WO | WO 97/49334 | 12/1997 |
| WO | WO 99/26078 | 5/1999 |
| WO | WO 01/20570 A1 | 3/2001 |

* cited by examiner

*Primary Examiner*—Jose L. Couso
(74) *Attorney, Agent, or Firm*—Quarles & Brady LLP

(57) ABSTRACT

Magnetic scanning apparatus including means for generating an excitation magnetic field 1 in a region in which a specimen to be scanned may be placed, a detector 3 for detecting a magnetic field originating from or modified by a specimen being scanned and a sheet of magnetic material 2 to nullify the excitation field in the region of the detector 3. The means for generating the excitation field 1 may be an array of permanent magnets 6. The detector 3 may be an array of galvom devices such as Hall Effect devices. A display 5 may be included in the detector. The display may include a number of pixels, one for each of the galvomagnetic devices of the detector 3.

11 Claims, 2 Drawing Sheets

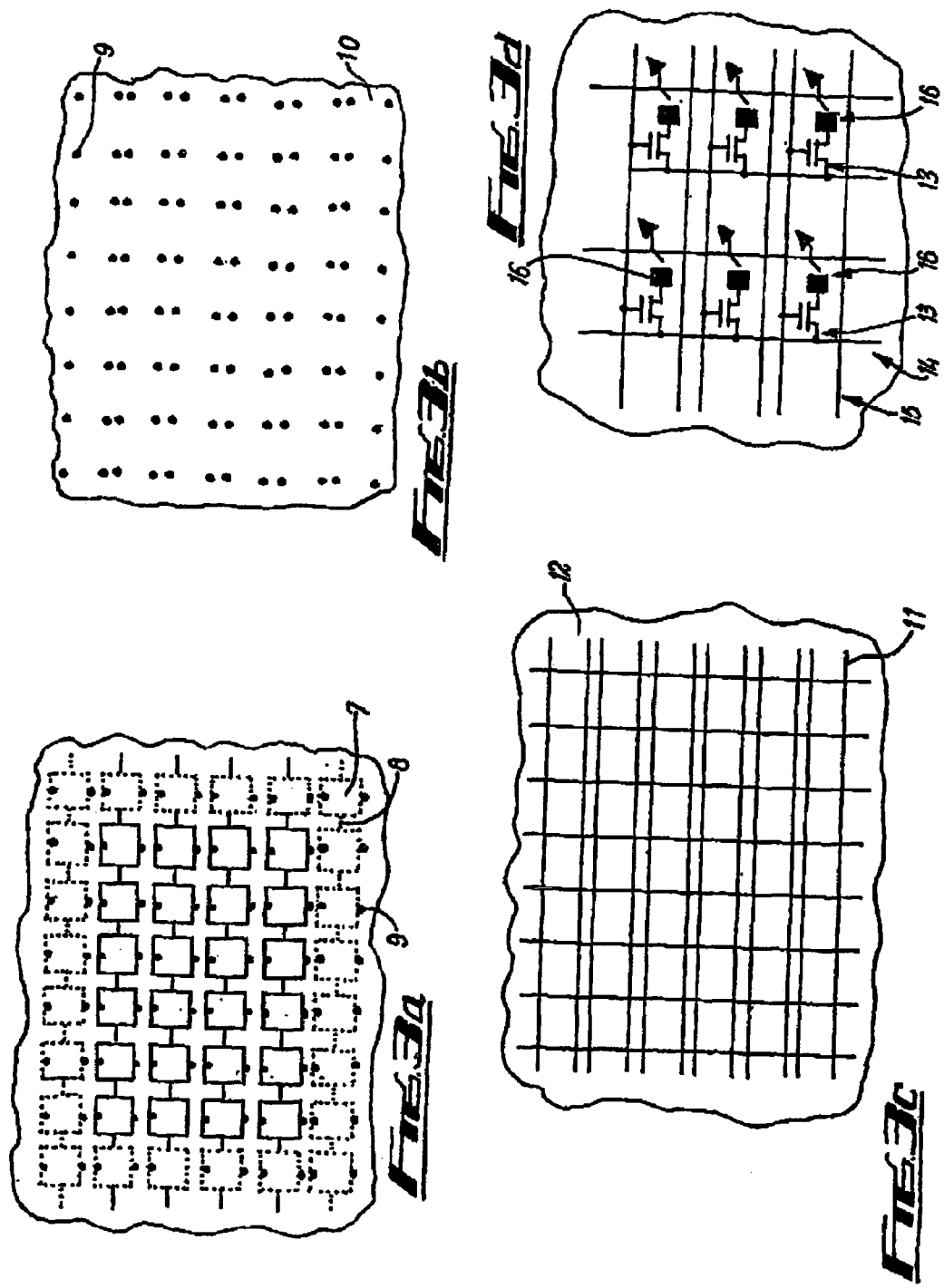

MAGNETIC SCANNING APPARATUS

STATEMENT OF RELATED APPLICATIONS

This application claims priority to Patent Cooperation Treaty Application No. PCT/GB 02/01135, filed on Mar. 13, 2002, and to United Kingdom Patent Application No. 0106355.1, filed on Mar. 14, 2001.

BACKGROUND OF THE INVENTION

1. Field of the Invention

The present invention relates to magnetic scanning apparatus, particularly, although not exclusively for medical purposes, and to a detector for use with such apparatus.

2. Description of the Related Art

The use of a magnetic field to provide an image showing variations of magnetic susceptibility within a body is known. Apparatus for scanning a body which exploits this method is described in U.S. Pat. No. 4,969,469 and U.S. Pat. No. 5,073,858. This apparatus is, generally speaking, complex.

SUMMARY OF THE INVENTION

According to a first aspect of the present invention there is provided magnetic scanning apparatus for scanning a specimen to obtain an image, the apparatus including means for generating an excitation magnetic field in a region in which a specimen to be scanned may be placed, a detector for detecting a magnetic field originating from or modified by a specimen being scanned, and a means for nullifying the excitation magnetic field in the region of the detector wherein the means for nullifying comprises a sheet of magnetic material.

The sheet of magnetic material is preferably flexible. It preferably features a magnetic material, such as hard magnetic ferrite powder, disposed in a sheet of flexible material such as a rubber, plastics or similar material.

The means for generating an excitation field preferably includes one or more permanent magnets, particularly rare earth permanent magnets. Preferably an array of magnets is comprised in a sheet.

The detector preferably includes an array of galvomagnetic devices, particularly Hall effect devices. The array is preferably comprised in a single semiconductor device. Each device is preferably associated with a respective thin film transistor, which may be comprised in the same semiconductor device as the Hall effect device.

The apparatus further preferably includes a display operative to display an image derived from magnetic field detected by the detector. The display preferably includes a plurality of pixels. Preferably a respective pixel is provided for each device of the array of the detector. A processing means may be provided for processing the output of the detector to generate an image for display by the display. Where the display includes a respective pixel for each detector in a detector array, the requirements of any processing device are simplified. The display may be a liquid crystal display.

In an alternative embodiment the detector includes one or more detector devices mounted on a drive means operative to move the devices in a plane, to detect magnetic field in the plane.

According to a second aspect of the present invention there is provided a detect or for use with magnetic scanning apparatus including an array of galvomagnetic devices comprised in a single semiconductor device.

The galvomagnetic devices are preferably Hall effect devices. Each device is preferably associated with a respective thin film transistor, which may be included in the same semiconductor device as the detector.

The detector preferably includes a display. This may be a liquid crystal display. The display preferably includes a plurality of pixels. Preferably at least one pixel is provided for each device of the array respectively. The display is preferably comprised in a single unit with the detector. A processing means may be provided for processing the output of the devices to generate an image on the display.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

BRIEF DESCRIPTION OF THE DRAWINGS

FIGS. 3a-3d are enlarged plan views of part of the detector array of the apparatus of FIG. 1 showing different stages during its manufacture.

DETAILED DESCRIPTION OF THE PREFERRED EMBODIMENTS

Figure 1:
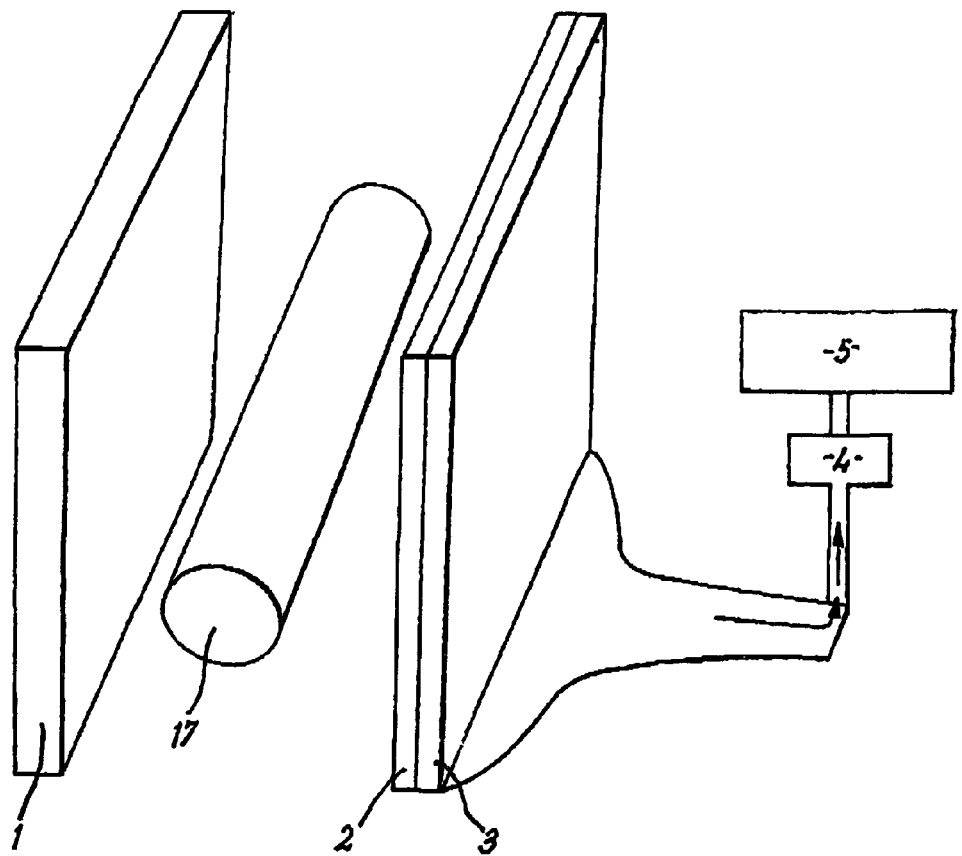
FIG. 1 is a schematic perspective view of scanning apparatus according to the invention.
Figure 2:
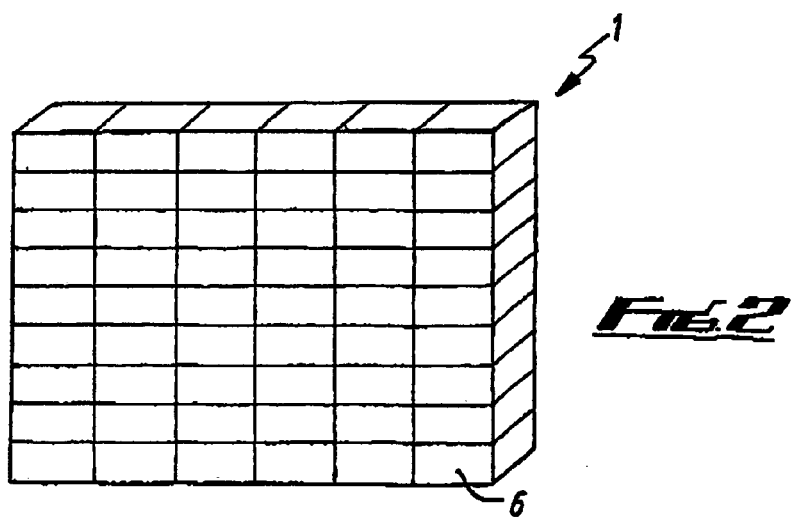
FIG. 2 is a perspective view of the excitation magnetic sheet of FIG. 1.

Referring to the drawings, the apparatus has an excitation magnetic sheet 1, nullification magnetic sheet 2, detector array 3, signal processing means 4 and display 5.

The excitation magnetic sheet 1 includes a two dimensional array of permanent rare earth magnets 6. The nullification magnetic sheet 2 includes a flexible sheet of rubber, plastics or like material in which is disposed magnetic ferrite powder.

The detector array 3 includes an array of substantially square, planar Hall effect devices 7 formed on a single sheet of semiconductor material using two dimensional quantum well concepts. The devices are electrically connected in series parallel by conductors 8 extending from the approximate midpoint of opposite sides respectively of each device 7.

Metallized output contacts 9 are provided at the approximate midpoint of each of the two remaining sides of each device 7.

Following formation of the Hall effect devices 7, conductors 8 and output contacts 9, the array is covered with an electrically insulating SiO (Silicon Monoxide) layer 10, leaving only the metallized output contacts 9 exposed.

A net linear matrix of electrical conductors 11 is superimposed over the SiO layer 10, the conductors 11 forming the matrix being separated, where required, by further SiO layers 12. A conductor of the matrix 11 is connected to each of the metallized contacts 9 respectively.

Superimposed over the matrix of conductors 11 are a plurality of TFTs (thin film transistors) 13, one associated with each Hall effect device 7. Each TFT 13 is connected between a scanline 14 and a dataline 15 of the matrix 11. Each TFT 13 provides a switch, supplying electrical current to an element 16 of a display 5.

In one embodiment, as illustrated, the switched output from each TFT is fed to a processor 4 that processes the received information and supplies this to a display 5 to provide a visual image. The display 5 is preferably a liquid crystal display and preferably, in use, each Hall effect device 7 of the detector array is exclusively associated with at least one pixel of the display.

In another embodiment, liquid crystal pixels are provided on the detector array and each TFT 13 is connected to a respective pixel 16, either directly or via a processor 4. This enables the detector array and a display to be combined in a single unit, allowing the apparatus to be conveniently portable.

In use the magnetic excitation sheet 1 is placed adjacent one side of a specimen 17 to be scanned for example a part of a human body. The nullification sheet 2 and detector array 3 are placed adjacent the opposite side of the specimen 17, so that the specimen is disposed between the excitation sheet 1 on the one hand and the nullification 2 and detector array 3 on the other hand. The nullification sheet 2 is preferably placed close to, more preferably in contact with, the detector array 3 on the side of the detector array facing the specimen to be scanned.

The magnetic excitation sheet 1 is operative to produce a relatively strong magnetic field extending towards the detector array 3. This field will be modified by the specimen 17 in dependence upon its magnetic susceptibility.

The nullification sheet 2 is operative to produce a magnetic field of opposite polarity to the excitation sheet 1 arranged to nullify the effect of the magnetic field produced by the excitation sheet 1 on the detector array 3. Because of the relative closeness of the nullification sheet 2 to the detector array 3 compared to the excitation sheet 1 the field strength produced by the nullification sheet 2 can be much weaker than that produced by the excitation sheet 1.

The result is that the detector array 3 is only exposed to a magnetic field comprised of the redistribution of the flux density of the field produced by the excitation sheet 1 caused by the presence of the specimen 17.

In use an electric current is passed through the rows of Hall effect devices 7 of the detector array 3, via conductors 8. The presence of any magnetic flux intersecting the Hall effect devices 7 gives rise to a Hall voltage between the metallized contacts 9 on each device, representative of the density of the flux. The detector array 3 thus produces a plurality of Hall voltages indicative of the strength of the magnetic field detected across the area of the detector array 3. These voltages are then processed, as appropriate, and used to generate an image on the display 5 corresponding to the variation in magnetic field intensity and thus variation in the magnetic susceptibility of the specimen 17, providing information about the specimen 17.

In an alternative embodiment, a fewer number of Hall effect devices than contained in the detector array 3, or even just a single device, are/is mounted on a drive means operative to move them/it over a two dimensional area and measurements of the magnetic field are made at different points in the area to build up an image.

The apparatus is particularly suited to scanning a human or animal body, the presence of blood affecting an applied magnetic field and enabling blood and bone to be distinguished. A non-limiting example of the orders of magnitude involved follows:

Given that a sample of blood has a susceptibility of $10^{-3}$ units and the applied magnetic field strength is $2 \times 10^5$ A/m.

Then $B = \mu_r \mu_0 H$ where $\mu_r = 1 + 10^{-3} = 1.001$

Thus $B = 1.001 \times 4\pi \times 10^{-7} \times 2 \times 10^5 = 251.3$ mT

In the absence of blood $B = 1 \times 4\pi 10^{-2} \times 2 \times 10^5 = 251.3$ mT Hence the magnetic flux density within the blood when introduced into the external field $\delta B = 0.3$ mT.

Next, assume that the introduction of blood into the excitation field (of density $2 \times 10^5$ A/m) leads to a variation of 10% of $\delta B$, i.e. 0.03 mT. Moreover, the sensitivity of a Hall device of the detector array is 1300 V/A.T.

Then, assuming a current drive of 1 mA, a Hall output voltage relating to an induction of 0.03 mT will give an output voltage of:

$1300 \times 1 \times 0.03 \times 10^{-3}$ mV or 30 µV (a voltage of this magnitude is easily measured).

It should be noted that 1) the assumed perturbation of the excitation field represents a percentage change of 0.012%; and 2) In the absence of blood, the normal Hall voltage would be: $1300 \times 1 \times 251.3 \times 10^{-3}$ mV or 326.3 mV and this has to be annulled by the nullification sheet to zero before the blood sample is inserted in the field.

The apparatus could, however, be employed to scan any specimen having variations in magnetic susceptibility.

The above embodiment is described by way of example only. Many variations are possible without departing from the invention. Indeed, changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

What is claimed is:

1. A magnetic scanning apparatus for scanning a specimen to obtain an image, the apparatus comprising:
    means for generating an excitation magnetic field in a region in which a specimen to be scanned may be placed,
    a detector for detecting a magnetic field originating from or modified by the specimen being scanned; and
    means for nullifying the excitation magnetic field in the region of the detector, wherein the means for nullifying comprises a sheet of magnetic material.

2. The apparatus as claimed in claim 1, wherein the sheet of magnetic material comprises a magnetic material disposed in a sheet of flexible material.

3. The apparatus as claimed in claim 1, wherein the means for generating an excitation magnetic field comprises an array of permanent magnets in a sheet.

4. The apparatus as claimed in claim 1, wherein the detector comprises an array of galvomagnetic devices.

5. The apparatus as claimed in claim 1, wherein the detector comprises an array of galvomagnetic devices in a single semiconductor device.

6. The apparatus as claimed in claim 1, wherein the detector comprises an array of galvomagnetic devices, with each device associated with a respective thin film transistor.

7. The apparatus as claimed in claim 1, further comprising a display operative to display an image derived from the magnetic field detected by the detector.

8. The apparatus as claimed in claim 1, further comprising a display operative to display an image derived from the magnetic field detected by the detector, wherein the detector comprises an array of galvomagnetic devices, the display comprises a plurality of pixels, and each pixel is associated with a respective galvomagnetic device of the detector.

9. The apparatus as claimed in claim 1, wherein the detector comprises one or more detector devices mounted on a drive means operative to move the detector devices in a plane to detect magnetic field in the plane.

10. A magnetic scanning apparatus for scanning a specimen to obtain an image, the apparatus comprising:
   means for generating an excitation magnetic field in a region in which a specimen to be scanned may be placed,
   a detector for detecting a magnetic field originating from or modified by the specimen being scanned; and
   means for nullifying the excitation magnetic field in the region of the detector, wherein the means for nullifying comprises a sheet of magnetic material, and wherein said means for generating an excitation magnetic field and said means for nullifying are spaced apart for receiving said specimen to be scanned therebetween.

11. A magnetic scanning apparatus for scanning a specimen to obtain an image, the apparatus comprising:
   means for generating an excitation magnetic field in a region in which a specimen to be scanned may be placed,
   a detector for detecting a magnetic field originating from or modified by the specimen being scanned,
   means for nullifying the excitation magnetic field in the region of the detector, wherein the means for nullifying comprises a sheet of magnetic material, and wherein said means for generating an excitation magnetic field and said means for nullifying are spaced apart for receiving said specimen to be scanned therebetween; and
   a display operative to display an image derived from the magnetic field detected by the detector.

* * * * *